United States Patent
Mirkamali et al.

(10) Patent No.: US 9,792,558 B2
(45) Date of Patent: Oct. 17, 2017

(54) USING A MESOSCOPIC SYSTEM TO GENERATE ENTANGLEMENT

(71) Applicant: QUANTUM VALLEY INVESTMENT FUND LP, Waterloo (CA)

(72) Inventors: Maryam Sadat Mirkamali, Waterloo (CA); David G. Cory, Branchton (CA)

(73) Assignee: Quantum Valley Investment Fund LP, Waterloo, Ontario (CA)

( * ) Notice: Subject to any disclaimer, the term of this patent is extended or adjusted under 35 U.S.C. 154(b) by 0 days.

(21) Appl. No.: 15/328,769

(22) PCT Filed: Sep. 16, 2015

(86) PCT No.: PCT/CA2015/000496
§ 371 (c)(1),
(2) Date: Jan. 24, 2017

(87) PCT Pub. No.: WO2016/041056
PCT Pub. Date: Mar. 24, 2016

(65) Prior Publication Data
US 2017/0213144 A1 Jul. 27, 2017

Related U.S. Application Data

(60) Provisional application No. 62/051,124, filed on Sep. 16, 2014.

(51) Int. Cl.
*B82Y 10/00* (2011.01)
*G06N 99/00* (2010.01)
(Continued)

(52) U.S. Cl.
CPC ......... *G06N 99/002* (2013.01); *G01R 33/326* (2013.01); *G01R 33/60* (2013.01)

(58) Field of Classification Search
CPC .................................................... G06N 99/002
(Continued)

(56) References Cited

U.S. PATENT DOCUMENTS

| | | |
|---|---|---|
| 6,605,822 B1 | 8/2003 | Blaise et al. |
| 2003/0111659 A1 | 6/2003 | Tzalenchuk et al. |

(Continued)

FOREIGN PATENT DOCUMENTS

| | | |
|---|---|---|
| WO | 02097725 A2 | 12/2002 |
| WO | 03054793 A2 | 7/2003 |
| WO | 2005093649 A1 | 10/2005 |

OTHER PUBLICATIONS

Canadian Intellectual Property Office; International Search Report & Written Opinoin for PCT/CA2015/000496; dated Nov. 30, 2015; 6 pages.

(Continued)

*Primary Examiner* — Louis Arana
(74) *Attorney, Agent, or Firm* — Henry Patent Law Firm PLLC

(57) ABSTRACT

In some aspects, a mesoscopic system is used to generate entanglement, for example, on a pair of qubits. In some implementations, the mesoscopic system includes a first spin, a second spin and multiple other spins. The initial state of the first and second spins can be separable (non-entangled) states. Measurement outcomes are obtained by performing projective measurements on the mesoscopic system. Based on the measurement outcomes, an entangled state of the first and second spins is detected. The entangled state is transferred from the first and second spins to the first and second qubits.

19 Claims, 2 Drawing Sheets

(51) Int. Cl.
*G01R 33/60* (2006.01)
*G01R 33/32* (2006.01)

(58) Field of Classification Search
USPC .................................................. 324/300, 304
See application file for complete search history.

(56) References Cited

U.S. PATENT DOCUMENTS

| | | | | |
|---|---|---|---|---|
| 2003/0173997 A1* | 9/2003 | Blais | .................... | B82Y 10/00 |
| | | | | 327/34 |
| 2004/0119061 A1* | 6/2004 | Wu | ........................ | B82Y 10/00 |
| | | | | 257/9 |
| 2008/0237579 A1* | 10/2008 | Barker | .................. | B82Y 10/00 |
| | | | | 257/30 |
| 2012/0050834 A1* | 3/2012 | Harrison | ................ | B82Y 10/00 |
| | | | | 359/107 |

OTHER PUBLICATIONS

Burkard, G. "Spin-entangled electrons in mesoscopic systems," Usp. Fiz. Nauk (Suppl.) 171 (10), Oct. 2001, pp. 126-131.
Giedke, G. "Quantum measurement of a mesoscopic spin ensemble," Physical Review A 74, 032316 (2006), 8 pages.

* cited by examiner

USING A MESOSCOPIC SYSTEM TO GENERATE ENTANGLEMENT

CROSS-REFERENCE TO RELATED APPLICATIONS

This application is a U.S. National Phase of PCT/CA2015/000496 filed on Sep. 16, 2015, which claims priority to U.S. Provisional Application Ser. No. 62/051,124, filed on Sep. 16, 2014, which is hereby incorporated by reference.

BACKGROUND

The following description relates to using a mesoscopic system to generate entanglement, for example, on a pair of qubits.

Entangled qubits are useful in a number of applications. For instance, entangled qubits can be used in quantum computing algorithms, quantum communication protocols, and other contexts. In some conventional systems, entanglement is generated by a direct interaction between the qubits. For example, entanglement between two spin-qubits can be generated by a dipolar interaction between the spins.

SUMMARY

In a general aspect, a mesoscopic system is used to generate entanglement on a pair of qubits. In some implementations, the mesoscopic system includes a first spin, a second spin and multiple other spins. The initial state of the first and second spins can be separable (non-entangled). Measurement outcomes are obtained by performing projective measurements on the mesoscopic system, and the projective measurements cause the first and second spins to become entangled. Based on the measurement outcomes, an entangled state of the first and second spins is detected. The entangled state is transferred from the first and second spins to the first and second qubits.

The details of one or more implementations are set forth in the accompanying drawings and the description below. Other features, objects, and advantages will be apparent from the description and drawings, and from the claims.

DETAILED DESCRIPTION

In some aspects of what is described here, a mesoscopic system is used to generate entanglement between two qubits. In some implementations, the mesoscopic system is coupled to two non-interacting qubits ($q_1$, $q_2$), and the mesoscopic system is used to generate entanglement between the qubits. For instance, the qubits can transit from separable (i.e., non-entangled) quantum states to an entangled quantum state as a result of the qubits' respective interactions with the mesoscopic system. The transition from the separable states to an entangled state can occur independent of any direct coupling or direct interaction between the two qubits.

In some examples, the mesoscopic system is a spin system that includes a first spin ($s_1$) that interacts with one of the qubits ($q_1$), a second spin ($s_2$) that interacts with the other qubit ($q_2$), and a number of other spins. In such examples, the qubits can be spin qubits that interact with the mesoscopic system, for instance, through a dipolar coupling between the first qubit and the first spin, and another dipolar coupling between the second qubit and the second spin. The two qubits ($q_1$, $q_2$) can be, for example, separate nodes of a quantum network or computer, components of a quantum repeater, etc. In some examples, other types of mesoscopic systems and other types of qubits may be used.

In some examples, two spin qubits are entangled by exploiting the properties of projective measurements on a mesoscopic system and dipolar couplings between the spin qubits and the mesoscopic system. For instance, two successive projective measurements can be used as a tool for entangling two spins in the mesoscopic system; the mesoscopic system can be initially prepared with the two spins in a separable state, and two projective measurements can be used with post-selection to produce an entangled state on the two spins in the mesoscopic system. The entangled state can then be transferred to the two spin qubits, which are external to the mesoscopic system.

Figure 1:
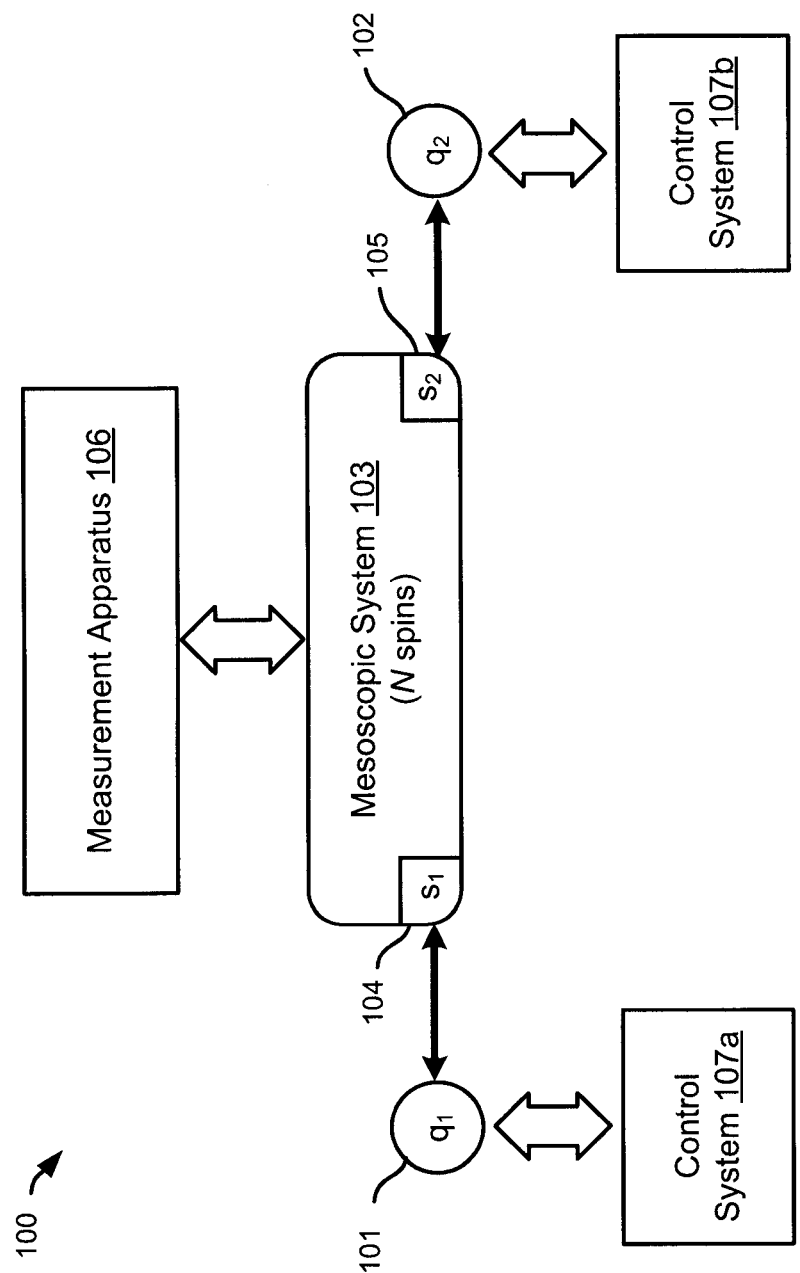
FIG. 1 is a schematic diagram showing an example system that includes two qubits and a mesoscopic system.

FIG. 1 is a schematic diagram showing an example system 100 that includes two qubits 101, 102 and a mesoscopic system 103. The system 100 also includes a measurement apparatus 106 and one or more control systems 107a, 107b. The measurement apparatus 106 is configured to perform projective measurements on the mesoscopic system 103. The control systems 107a, 107b are configured to manipulate the respective states of the qubits 101, 102 and the mesoscopic system 103. The example system 100 can include additional or different features and components, and the components of the system 100 can be arranged or configured in another manner.

In the example shown in FIG. 1, the qubits 101, 102 do not directly interact with each other, and they are physically separated from each other by a distance, for instance, on the order of nanometers (nm) to micrometers (μm) or more. Each of the example qubits 101, 102 is a two-level quantum system that can store one quantum bit of information. For example, each qubit 101, 102 can assume a quantum state that can be represented as one of two computational basis states $|0\rangle$ and $|1\rangle$ or any superposition of the two computational basis states $|0\rangle$ and $|1\rangle$. Each qubit 101, 102 can be, for example, an NV (nitrogen vacancy) center in diamond, a quantum dot, a trapped ion or another size or type of two-level quantum system.

The example mesoscopic system 103 shown in FIG. 1 is a system of N spins, which includes a first spin 104, a second spin 105 and N–2 additional spins. Typically a mesoscopic system is a system of intermediate size, between a regime that is well-described by quantum physics and a regime that is well described by classical physics. The example mesoscopic system 103 shown in FIG. 1 is a spin system in which a single spin flip can be detected by the measurement apparatus 106. In some implementations, the mesoscopic system is large, does not have all of the properties of a closed quantum system, and does have properties that are not shared by all classical systems.

The mesoscopic system 103 can include, for example, a small array of electron or nuclear spins (e.g., on the order of $10^3$ to $10^{10}$ spins) or another size or type of spin system. In some cases, an electron spin system may be preferable to a nuclear spin system due the electron's larger magnetic moment. For instance, the magnetic moment of an electron spin is about three orders of magnitude larger than the magnetic moment of a typical nuclear spin, making a single spin flip more easily detectable in the electronic spin system.

As a specific example, one candidate for the mesoscopic spin system 103 is a two-dimensional Langmuir-Blodgett film attached to a diamond material that contains the qubits 101, 102. As another specific example, another candidate for the mesoscopic system 103 is a system of P1 centers (electronic spins of the substitutional-nitrogen defects) in a diamond material that contains the qubits 101, 102. Other types of mesoscopic systems can be used.

As shown in FIG. 1, the qubits 101, 102 are external to the mesoscopic system 103; the first spin 104 in the mesoscopic system 103 interacts with the first qubit 101, and the second spin 105 in the mesoscopic system 103 interacts with the second qubit 102. The interaction between the qubits 101, 102 and the spins 104, 105 in the mesoscopic system 103 can be, for example, a magnetic dipole coupling, a hyperfine coupling or another type of interaction. The specific type of interaction will depend, for example, on the specific properties of the mesoscopic system 103 and qubits 101, 102. Each qubit can be configured to interact with one of the respective spins in the mesoscopic system, for example, by the location and orientation of the qubit relative to the spin.

The spins 104, 105 are part of the mesoscopic system 103, and the measurement apparatus 106 can perform measurements on the mesoscopic system 103 including and excluding these two spins 104, 105. For instance, a measurement can be performed on all N spins (including spins 104, 105) in the mesoscopic system 103, and a measurement can be performed on the N−2 spins (excluding spins 104, 105). In the example shown, the measurement apparatus 106 is configured to perform both types of measurements, because the spins 104, 105 are distinguishable from the other N−2 spins in the mesoscopic system 103 due to their interaction with the qubits 101, 102.

The example measurement apparatus 106 can be, for example, a high resolution magnetometer with high sensitivity (e.g., a DC SQUID) that can perform projective measurements of the mesoscopic system 103. As another example, the measurement apparatus 106 can include a spin that interacts with all N spins (the spins to be measured) symmetrically and itself can be measured projectively, for instance, in the manner described in "Quantum measurement of a mesoscopic spin ensemble" by G. Giedke, J. M. Taylor, D. D'Alessandro, M. D. Lukin, and A. Imamoğlu (*Physical Review A*, 74, 032316 (2006)). Other types of measurement apparatus may be used.

The control systems 107a, 107b can include one or more systems or apparatus that can control the qubits 101, 102 and the mesoscopic system 103. In some cases, the control systems 107a, 107b include hardware configured to interact with the quantum degrees of freedom of the respective qubits 101, 102 and the spins in the mesoscopic system 103. For example, the control systems 107a, 107b may include coils, magnets, cavities, optical instruments, current or charge sensors, or other components. The control systems 107a, 107b may also include chambers, pumps, cryogenic systems, or any other suitable combination of these and other hardware components, which may be controlled by external computing systems, to control temperatures, pressures, positions, orientations, or other physical conditions of the qubits 101, 102 and the mesoscopic system 103.

In some cases, the mesoscopic system 103 and the qubits 101, 102 are each controlled by distinct control systems, or a common control system can be used to control the mesoscopic system 103 and the qubits 101, 102. The control systems 107a, 107b can be configured to initialize the qubits 101, 102 or the mesoscopic system 103 (or both); to apply logical operations (e.g., quantum logic gates, quantum logic circuits, etc.) to the qubits 101, 102 or the mesoscopic system 103 (or both); to measure (readout) the states of the qubits 101, 102 or the mesoscopic system 103 (or both); or to perform a combination of these and other types of operations. For instance, to perform the example quantum circuit 200 shown in FIG. 2, the control systems 107a, 107b can be configured to prepare the initial states at 212a, 212b; to perform post-selection at 216; to perform the swap gates at 218a, 218b; etc. In some cases, all or part of the measurement apparatus 106 can be included in the control systems 107a, 107b, or the measurement apparatus 106 can operate independent of the control systems 107a, 107b.

In the example shown in FIG. 1, the first control system 107a provides control over the first spin-qubit pair $(s_1, q_1)$ and the second control system 107b provides control over the second spin-qubit pair $(s_2, q_2)$. The control over the first spin-qubit pair $(s_1, q_1)$ and the second spin-qubit pair $(s_2, q_2)$ can be used to prepare the initial (separable) states of the spins and qubits, to transfer the entangled state from the spins to the qubits, and to perform other operations. In some cases, control over the qubits 101, 102 and spins 104, 105 can be achieved, for instance, through microwave pulses and dipolar (or Hyperfine) coupling. As a particular example, when the qubits 101, 102 are implemented as NV centers in diamond, microwave pulses generated by a cavity or resonator can control the qubits 101, 102, and the dipolar or Hyperfine coupling between the NV centers and nearby electrons can be used to control the electron spins in the mesoscopic system 103. In addition, when the qubits 101, 102 are implemented as NV centers in diamond, optics can be used to initialize and readout the states of the NV centers.

The components in the example system 100 shown in FIG. 1 can be used to perform individual operations in a process that entangles the two qubits 101, 102. For instance, the control systems 107a, 107b can initialize the qubits 101, 102 and perform control over each respective qubit 101, 102 and its nearby spin 104, 105 in the mesoscopic system 103. Also, the measurement apparatus 106 can perform a projective measurement on all N spins in the mesoscopic system 103 (including $s_1$ and $s_2$), and the measurement apparatus 106 can perform a projective measurement on the N−2 spins in the mesoscopic system 103 (excluding $s_1$ and $s_2$).

Figure 2:
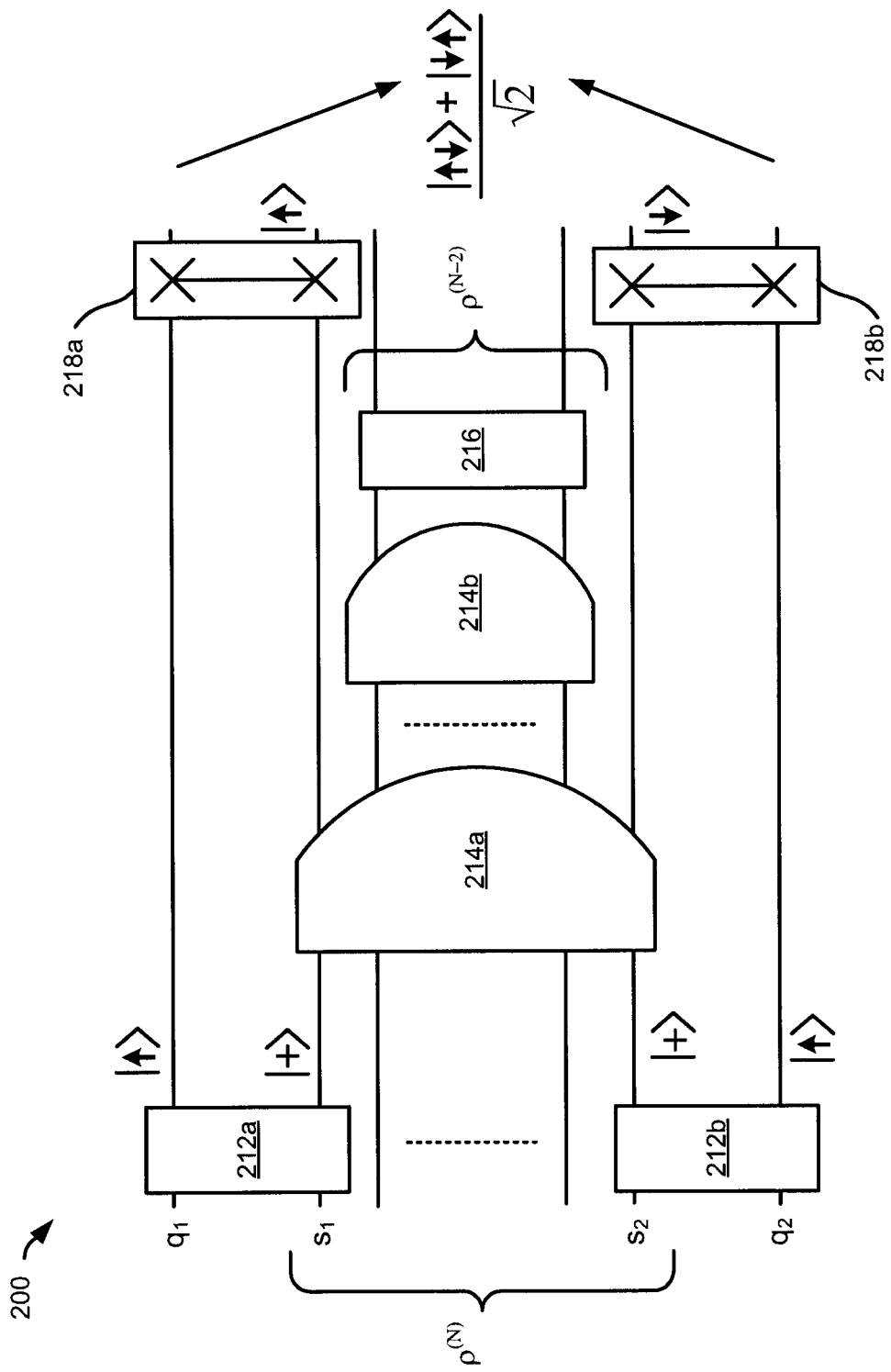
FIG. 2 is a diagram of an example quantum circuit that generates an entangled state.

FIG. 2 is a diagram of an example quantum circuit 200 that generates an entangled state. As shown in FIG. 2, the quantum circuit 200 operates on two qubits $(q_1, q_2)$ and a system of N spins, which includes two spins $(s_1, s_2)$ and N−2 other spins. The system of N spins is represented by the density matrix $\rho^{(N)}$; the subsystem of N−2 spins (which does not include the two spins $(s_1, s_2)$) is represented by the density matrix $\rho^{(N-2)}$.

In the example shown in FIG. 2, the system of N spins is a mesoscopic system. The quantum circuit 200 can be applied to other sizes and types of mesoscopic systems. In some cases, the mesoscopic system is an electron spin system that has certain properties. For instance, the size of the mesoscopic system can be small enough so that its magnetization can be measured with resolution Δm=1; and the mesoscopic system can be sufficiently large such that the qubits are far away enough with no direct dipolar interaction. In the example shown, the magnetization of the N spins in the mesoscopic system is preserved between the two measurements; this can be accomplished, for example, by having the $T_1$ relaxation time to be long compared to the experiment time, and by having the dipolar interaction among the spins in the mesoscopic system to be either compatible with the measurement operators or weak enough to not influence the magnetization. The mesoscopic system can be prepared in the separable initial state shown in FIG. 2 (also shown in Equation 1 below). In some implementations, the mesoscopic system will have all these properties if the dipolar interaction between $s_1$ and $s_2$ and the rest of the spins in the mesoscopic system is negligible, and the $T_1$ relaxation time is sufficiently long. The dipolar interaction among the N−2 spins in the mesoscopic system is not problematic since the flip-flop terms of the interaction does not change the total magnetization, and the flip-flip and flop-flop terms of the interaction are forbidden according to secular approximation.

In some implementations, the example quantum circuit 200 shown in FIG. 2 can be performed by the example system 100 shown in FIG. 1. For instance, the two qubits ($q_1$, $q_2$) in FIG. 2 can be the qubits 101, 102 shown in FIG. 1, and the system of N spins can be the mesoscopic system 103 shown in FIG. 1; the projective measurements in the quantum circuit 200 can be performed by the measurement apparatus 106, and state preparation and control can be performed by the control systems 107a, 107b. The quantum circuit 200 can be performed in other types of systems, for example, using other types of spins, qubits, components and techniques.

The example quantum circuit 200 entangles the two qubits ($q_1$, $q_2$) by first entangling the corresponding spins ($s_1$, $s_2$) in the mesoscopic system, and then applying a swap gate on each spin-qubit pair ($s_i$, $q_i$; i=1, 2). The quantum circuit 200 can include additional or different operations; in some cases, operations can be applied in the order shown or in another order, operations can be applied in parallel or in series, multiple operations can be combined into a single operation, or an individual operation can be divided into multiple operations. In some implementations, one or more operations in the quantum circuit 200 are repeated or iterated, for example, until a terminating condition is reached.

In the example shown, the spins ($s_1$, $s_2$) in the mesoscopic system become entangled due to the properties of the projective measurement acting on the mesoscopic system. In particular, the mesoscopic system is prepared in an initial state, and then its magnetization is measured along the polarization axis (e.g., an $M_z$ measurement along the Z-axis) twice through two distinct projective measurements. In the first projective measurement, the full system of N spins is measured; in the second measurement, the subsystem of N−2 spins is measured. Entanglement between the two qubits ($s_1$, $s_2$) can be identified by post-selecting on the projective measurements that have the same result. In particular, if both projective measurements have the same result, one of the spins ($s_1$, $s_2$) has spin up and the other has spin down, but it is unknown which one is which. This lack of information can be utilized to prepare the two spins ($s_1$, $s_2$) in the singlet state or the triplet zero state, which are both entangled states.

As shown in FIG. 2, at 212a and 212b, the spins ($s_1$, $s_2$) and qubits ($q_1$, $q_2$) are initialized by preparing the qubits and the mesoscopic system in initial states. For example, at 212a, the control system 107a can apply a first preparation sequence to the first spin-qubit pair (101, 104); and at 212b, the control system 107b can apply a second preparation sequence to the second spin-qubit pair (102, 105).

In some cases, additional preparation operations or sequences are applied. For instance, before input state preparation sequences are applied to the spins ($s_1$, $s_2$) and qubits ($q_1$, $q_2$), the full system of N spins (and in some cases, the qubits) may be polarized by application of a polarizing field. In some examples, the polarizing field is a static ($B_0$) magnet field that defines an axis of polarization (e.g., the Z-axis), and the spins evolve under a $T_1$-relaxation process to a thermal equilibrium state that is polarized along the axis of polarization. Additional or different types of processes may be applied to prepare the initial states.

In the example shown, the initial states of the two qubits ($q_1$, $q_2$) and the corresponding spins ($s_1$, $s_2$) in the mesoscopic system are separable states. In other words, immediately after the initial state preparation at 212a and 212b, there is no entanglement among the qubits ($q_1$, $q_2$) and spins ($s_1$, $s_2$). In the particular example shown in FIG. 2, both qubits are prepared in their spin-up state ($|\uparrow\rangle$), and the initial state of the system of N spins can be any of the general (and typically easy-to-generate) class of states:

$$\rho_N = |+\rangle\langle+| \otimes |+\rangle\langle+| \otimes \rho_{N-2} \qquad (1)$$

Here, the first two states in Equation 1 represent the states of the spins $s_1$ and $s_2$, where $$|+\rangle = \frac{1}{\sqrt{2}}(|\uparrow\rangle + |\downarrow\rangle),$$

and $\rho_{N-2}$ is an arbitrary state over the other N−2 spins in the mesoscopic system. In this example, there is no requirement on $\rho_{N-2}$, it could be any pure or mixed state. The state of the spins ($s_1$, $s_2$) in Equation 1 (i.e., $|+\rangle\langle+| \otimes |+\rangle\langle+|$) is one example of the spins ($s_1$, $s_2$) being in separble states. In some cases, the initial state of the mesoscopic system includes the spins ($s_1$, $s_2$) in other separble states, such as, for example, ($|+\rangle\langle+| \otimes |-\rangle\langle-|$ or $|-\rangle\langle-| \otimes |+\rangle\langle+|$), where $$|-\rangle = \frac{1}{\sqrt{2}}(|\uparrow\rangle - |\downarrow\rangle).$$

Similarly, the initial separable states of the qubits ($|\uparrow\rangle$, $|\uparrow\rangle$) in FIG. 2 are provided as an example, and the qubits can be prepared in other separable states.

At 214a and 214b, after the initial states of the qubits and the mesoscopic system have been prepared, a series of measurement outcomes are obtained by performing a series of projective measurements on the mesoscopic system. The series of projective measurements can cause the spins ($s_1$, $s_2$) to transition from their initial, separable states to an entangled state. In the example shown, two projective measurements are performed: (1) at 214a, a first projective measurement of all N spins (i.e., the first spin $s_1$, the second spin $s_2$ and the other N−2 spins), and (2) at 214b, a second projective measurement of only the N−2 other spins (i.e., excluding the first spin $s_1$ and the second spin $s_2$). In some cases, the series of projective measurements includes additional or different measurements.

At 214a, the projective measurement is applied on the full system of N spins by a measurement apparatus configured to perform projective measurements on the mesoscopic system. For example, the measurement apparatus 106 can perform a projective measurement on the full mesoscopic system 103 (including the two spins 104, 105). The measurement can be applied along a polarization axis (e.g., Z-axis) to measure the magnetization of the N spins. The outcome of the measurement at 214a can be represented as $m_0$.

At 214b, the projective measurement is applied on the subsystem of N−2 spins by a measurement apparatus configured to perform projective measurements on the mesoscopic system. For example, the measurement apparatus 106 can perform a projective measurement on a subsystem that includes all spins in the mesoscopic system 103 except the two spins 104, 105. The measurement can be applied along a polarization axis (e.g., Z-axis) to measure the magnetization of the N−2 spins. The outcome of the measurement at 214b can be represented as $m_1$.

At 216, post-selection is applied based on the measurements at 214a and 214b. The post-selection can be performed, for example, by the control systems 107a, 107b based on comparing the results of the projective measurements performed at 214a and 214b. In the example shown in FIG. 2, if the measurement outcomes from the projective measurements at 214a and 214b are the same (i.e., if $m_1=m_0$), the state is accepted and the quantum circuit 200 proceeds; if the if the measurement outcomes from the projective measurements at 214a and 214b are not the same (i.e., if $m_1 \neq m_0$), the state is not accepted and the quantum circuit 200 can start over. The probability of the measurements at 214a and 214b having the same outcomes ($m_1=m_0$) is 0.5. The other two possible outcomes of the measurement at 214b are $m_1=m_0-1$ and $m_1=m_0+1$, each of which can occur with probability 0.25.

In the quantum circuit 200, post-selection is applied at 216 to detect, based on the series of measurement outcomes from the series of projective measurements, whether the spins ($s_1$, $s_2$) are in an entangled state. In the example shown in FIG. 2, the post-selection (at 216) after the two projective measurements (at 214a and 214b) can detect that the two spins $s_1$ and $s_2$ are in the triplet zero entangled state $$|T^{(0)}\rangle = \frac{1}{\sqrt{2}}(|\uparrow\downarrow\rangle + |\downarrow\uparrow\rangle).$$

In some cases, post-selection is applied to detect another entangled state. In the example shown, the entangled state is detected by detecting the same measurement outcome from the two sequential projective measurements (at 214a, 214b). In some cases, an entangled state is detected based on another combination of measurement outcomes. In some iterations of the quantum circuit 200, the post-selection at 216 does not detect that the spins are in an entangled state (e.g., when the measurement outcomes are not equal), and a new iteration of the quantum circuit 200 can be initiated.

At 218a and 218b, the qubits $q_1$ and $q_2$ are transformed to the triplet zero entangled state by applying a swap gate on the respective spin-qubit pairs ($s_i$, $q_i$; i=1, 2). At 218a, a swap gate is applied to the first spin-qubit pair ($s_1$, $q_1$); and at 218b, a swap gate is applied to the second spin-qubit pair ($s_2$, $q_2$). A swap gate applied to two qubits swaps (or exchanges) the states of the two qubits. Thus, the swap gates applied at 218a and 218b in FIG. 2 transfer the entangled state from the spins ($s_1$, $s_2$) to the qubits ($q_1$, $q_2$), and transfer the separable state from the qubits ($q_1$, $q_2$) to the spins ($s_1$, $s_2$).

Swap gates can be applied, for example, by the control systems 107a, 107b interacting with the respective qubits 101, 102, the spins 104, 105, or a combination of the spins and the qubits. The swap gates transfer the entangled states to the qubits ($q_1$, $q_2$) independent of any direct interaction between the qubits ($q_1$, $q_2$). For instance, the entangled state can be transferred from the spins ($s_1$, $s_2$) to the qubits ($q_1$, $q_2$) through direct couplings (e.g., dipolar couplings, hyperfine couplings, etc.) between the respective spin-qubit pairs. The swap gates shown in FIG. 2 are an example of operations that can transfer an entangled state from the spins ($s_1$, $s_2$) to the qubits ($q_1$, $q_2$); in some cases, other types of operations can be used to transfer an entangled state from the spins ($s_1$, $s_2$) to the qubits ($q_1$, $q_2$).

With the initial states shown in FIG. 2, after the post-selection (at 216) and swap gates (at 218a, 218b), the qubits are in the triplet zero state $$|T^{(0)}\rangle = \frac{1}{\sqrt{2}}(|\uparrow\downarrow\rangle + |\downarrow\uparrow\rangle).$$

This state will be reached for any iteration of the quantum circuit 200 where the post-selection (at 216) detects the same outcomes from the two sequential projective measurements at 214a, 214b. The probability of this result on any given iteration will be 0.5. Alternatively, different initial states can be used to prepare the qubits in a different entangled state. In particular, to entangle the two qubits in the singlet state (as opposed to the triplet zero state), one of the two qubits ($q_1$, $q_2$) is initially prepared in the $|-\rangle$ state, where $$|-\rangle = \frac{1}{\sqrt{2}}(|\uparrow\rangle - |\downarrow\rangle).$$

For instance, if the first spin $s_1$ is prepared in the $|+\rangle$ state at 212a, and the second spin $s_2$ is prepared in the $|-\rangle$ state at 212b, then the qubits ($q_1$, $q_2$) will be in the singlet state $$|S\rangle = \frac{1}{\sqrt{2}}(|\uparrow\downarrow\rangle - |\downarrow\uparrow\rangle)$$

rather than the triplet zero state, after the post-selection (at 216) and swap gates (at 218a, 218b).

In this following discussion, we consider the example shown in FIG. 2 and prove mathematically that the two successive projective measurements at 214a, 214b with the post-selection at 216 will result in an entangled state over the two spins $s_1$ and $s_2$. In this proof, we consider projector valued measure (PVM) measurements as an example. The method is more general and the preferred implementation in not based on a PVM measurement. We represent the set of the measurement operators for measuring magnetization of N particles along the Z-axis as $\{\Pi_m^{(N)}\}$, with:

$$\Pi_m^{(N)} = \sum_i P_i(|\uparrow\rangle\langle\uparrow|^{\otimes N/2+m} |\downarrow\rangle\langle\downarrow|^{\otimes N/2-m}), \quad (2)$$

where $$m = \left\{\frac{-N}{2}, \frac{-N}{2}+1, \ldots, \frac{N}{2}\right\}$$

is the outcome of the measurement and the summation is over all possible permutations.

According to the properties of PVM measurements, the first projective measurement results in an outcome $m_0$ with probability $$P_{m_0}^{(N)} = Tr(\Pi_{m_0}^{(N)} \rho_N \Pi_{m_0}^{(N)}), \qquad (2)$$

and the state of the system after the measurement is:

$$\rho'_N = \frac{1}{P_{m_0}^{(N)}} \prod_{m_0}^{(N)} \rho_N \prod_{m_0}^{(N)} \qquad (3)$$

To simplify the Equation 3, one can rewrite $\Pi_{m_0}^{(N)}$ as:

$$\prod_{m_0}^{(N)} = \sum_i P_i(|\uparrow\rangle\langle\uparrow|^{\otimes N/2+m_0}|\downarrow\rangle\langle\downarrow|^{\otimes N/2-m_0}) = \qquad (4)$$

$$|\uparrow\uparrow\rangle\langle\uparrow\uparrow| \otimes \sum_i P'_i(|\uparrow\rangle\langle\uparrow|^{\otimes(N-2)/2+(m_0-1)}|\downarrow\rangle\langle\downarrow|^{\otimes(N-2)/2-(m_0-1)}) +$$

$$(|\uparrow\downarrow\rangle\langle\uparrow\downarrow| + |\downarrow\uparrow\rangle\langle\downarrow\uparrow|) \otimes$$

$$\sum_i P''_i(|\uparrow\rangle\langle\uparrow|^{\otimes(N-2)/2+m_0}|\downarrow\rangle\langle\downarrow|^{\otimes(N-2)/2-m_0}) + |\downarrow\downarrow\rangle\langle\downarrow\downarrow| \otimes$$

$$\sum_i P'''_i(|\uparrow\rangle\langle\uparrow|^{\otimes(N-2)/2+(m_0+1)}|\downarrow\rangle\langle\downarrow|^{\otimes(N-2)/2-(m_0+1)}) =$$

$$\prod_1^{(2)} \otimes \prod_{m_0-1}^{(N-2)} + \prod_0^{(2)} \otimes \prod_{m_0}^{(N-2)} + \prod_{-1}^{(2)} \otimes \prod_{m_0+1}^{(N-2)}.$$

By substituting Equation 4 into Equation 3 and replacing $\rho_N$ from Equation 1, one finds:

$$\rho'_N = \qquad (5)$$

$$\frac{1}{4P_{m_0}^{(N)}} \left( |\uparrow\uparrow\rangle\langle\uparrow\uparrow| \otimes \prod_{m_0-1}^{(N-2)} \rho_{N-2} \prod_{m_0-1}^{(N-2)} + (|\uparrow\downarrow\rangle + |\downarrow\uparrow\rangle)(\langle\uparrow\downarrow| + \langle\downarrow\uparrow|) \otimes \right.$$

$$\left. \prod_{m_0}^{(N-2)} \rho_{N-2} \prod_{m_0}^{(N-2)} + |\downarrow\downarrow\rangle\langle\downarrow\downarrow| \otimes \prod_{m_0+1}^{(N-2)} \rho_{N-2} \prod_{m_0+1}^{(N-2)} \right).$$

After applying the second projective measurement on N−2 spins and post-selecting on the outcome $m_0$, the density matrix of the MS collapses into:

$$\rho''_N = \frac{\left(1_2 \otimes \prod_{m_0}^{(N-2)}\right) \rho'_N \left(1_2 \otimes \prod_{m_0}^{(N-2)}\right)}{Tr\left(\left(1_2 \otimes \prod_{m_0}^{(N-2)}\right) \rho'_N \left(1_2 \otimes \prod_{m_0}^{(N-2)}\right)\right)}$$

$$= \frac{\frac{1}{4P_{m_0}^{(N)}}(|\uparrow\downarrow\rangle + |\downarrow\uparrow\rangle)(\langle\uparrow\downarrow| + \langle\downarrow\uparrow|) \otimes \left(\prod_{m_0}^{(N-2)} \rho_{N-2} \prod_{m_0}^{(N-2)}\right)}{\frac{2P_{m_0}^{(N-2)}}{4P_{m_0}^{(N)}}}$$

$$= \frac{1}{P_{m_0}^{(N-2)}} |T^{(0)}\rangle\langle T^{(0)}| \otimes \left(\prod_{m_0}^{(N-2)} \rho_{N-2} \prod_{m_0}^{(N-2)}\right)$$

where $$\frac{1}{P_{m_0}^{(N-2)}}$$

is the normalization factor with $$P_{m_0}^{(N-2)} = Tr\left(\prod_{m_0}^{(N-2)} \rho_{N-2} \prod_{m_0}^{(N-2)}\right)$$

and $$|T^{(0)}\rangle = \frac{1}{\sqrt{2}}(|\uparrow\downarrow\rangle + |\downarrow\uparrow\rangle).$$

Tracing over N−2 spins, we find:

$$\rho_{s_1 s_2} = Tr_{(N-2)}(\rho''_N) = \frac{1}{P_{m_0}^{(N-2)}} |T^{(0)}\rangle\langle T^{(0)}| Tr\left(\prod_{m_0}^{(N-2)} \rho_{N-2} \prod_{m_0}^{(N-2)}\right) = |T^{(0)}\rangle\langle T^{(0)}|$$

In some cases, the mesoscopic system is subject to amplitude damping caused by $T_1$ relaxation or another type of process. An amplitude damping or $T_1$ relaxation process is responsible for running a quantum system towards its thermal equilibrium mixed state which is determined by Boltzmann distribution. In the Markovian limit, one can model the amplitude damping process on the mesoscopic system with independent Kraus maps on individual spins evolving each spin toward the equilibrium state. In some cases, the deviation from the maximally-entangled state is linearly proportional to the number of spins in the mesoscopic system and the time between the two measurements, $Nt/T_1$, in the case if the measurements were instantaneous (a simplifying assumption). We can account for the measurement time by adding the duration of the second measurement, $N(t+t_2)/T_1$. With a completely mixed equilibrium state (a good approximation for high temperature, $k_B T \gg \Delta E$), the un-normalized state after the second measurement to the first order in $N\lambda = N(t+t_2)/T_1$ is:

$$\rho_{s_1 s_2} = \left(1 - \frac{N\lambda}{2}\right) |T^{(0)}\rangle\langle T^{(0)}| +$$

$$\frac{N\lambda}{8} \left(\left(1 - \frac{2m_0 - 4}{N}\right) |\uparrow\uparrow\rangle\langle\uparrow\uparrow| + \left(1 + \frac{2m_0 + 4}{N}\right) |\downarrow\downarrow\rangle\langle\downarrow\downarrow|\right),$$

where $m_0$ is the outcome of the measurements. To the first order in $N\lambda$, the off-diagonal terms of the maximally entangled $|T^{(0)}\rangle\langle T^{(0)}|$ are not reduced compared to the diagonal terms (the reduction of the off-diagonal terms happens in the second order), only extra terms proportional to the triplet one and the triplet minus one are added.

In a general aspect of what is described above, a pair of qubits is entangled. A mesoscopic system is prepared in an initial state. The mesoscopic system includes a first spin, a second spin and other spins. The initial state of the mesoscopic system includes a separable state of the first and second spins. After preparing the mesoscopic system in the initial state, a series of measurement outcomes are obtained by performing a series of projective measurements on the mesoscopic system. Performing the projective measurements causes the first and second spins to transition from the separable states to an entangled state. The entangled state of the first spin and the second spin is detected based on the series of measurement outcomes. The entangled state is transferred from the first spin and the second spin to a first qubit and a second qubit. The first and second qubits are external to the mesoscopic system.

In another general aspect of what is described above, a system includes a mesoscopic system, first and second qubits, a measurement apparatus and a control system. The mesoscopic system includes a first spin, a second spin and other spins. The first qubit is configured to interact with the first spin, and the second qubit is configured to interact with the second spin. The control system is configured to prepare the mesoscopic system in an initial state that comprises a separable state of the first and second spins. The measurement apparatus is configured to entangle the first and second spins by performing projective measurements on the mesoscopic system. The control system is configured to detect an entangled state of the first and second spins based on a series of measurement outcomes obtained by the measurement apparatus performing a series of projective measurements after the mesoscopic system has been prepared in the initial state. The control system is configured to transfer the entangled state from the first and second spins to the first and second qubits.

Implementations of these and other aspects may include one or more of the following features. The first qubit and the second qubit are prepared in separable initial states before transferring the entangled state from the first spin and the second spin to the first qubit and the second qubit. Transferring the entangled state from the first spin and the second spin to the first qubit and the second qubit includes applying a first swap gate to the first spin and the first qubit, and applying a second swap gate to the second spin and the second qubit. The series of projective measurements includes: a first projective measurement of the first spin, the second spin and the other spins; and a second projective measurement of only the other spins. Detecting that the first spin and the second spin are in the entangled state includes detecting the same measurement outcome from the first projective measurement and the second projective measurement.

Implementations of these and other aspects may include one or more of the following features. The mesoscopic system includes an electron spin system subject to a polarizing magnetic field, and performing the projective measurements includes measuring magnetization of the electron spin system along an axis of polarization defined by the polarizing magnetic field. The first qubit can be implemented as a first NV center in diamond material, and the second qubit can be implemented as a second NV center in diamond material.

Implementations of these and other aspects may include one or more of the following features. The initial state of the mesoscopic system comprises the other spins in a mixed state, the first spin in the |+⟩ state, and the second spin in the |+⟩ state or the |−⟩ state. The entangled state comprises the triplet zero state or the singlet state. The entangled state is transferred from the first spin and the second spin to the first qubit and the second qubit independent of direct coupling between the first qubit and the second qubit. The entangled state is transferred from the first spin and the second spin to the first qubit and the second qubit through a first coupling between the first spin and the first qubit and a second coupling between the second spin and the second qubit.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

What is claimed is:

1. A method of entangling qubits, the method comprising:
   preparing a mesoscopic system in an initial state, the mesoscopic system comprising a first spin, a second spin and other spins, the initial state comprising separable states of the first and second spins;
   after preparing the mesoscopic system in the initial state, obtaining measurement outcomes by performing projective measurements on the mesoscopic system, wherein performing the projective measurements causes the first and second spins to transition from the separable states to an entangled state;
   detecting, based on the measurement outcomes, that the first spin and the second spin are in the entangled state; and
   transferring the entangled state from the first spin and the second spin to a first qubit and a second qubit that are external to the mesoscopic system.

2. The method of claim 1, further comprising preparing the first qubit and the second qubit in separable initial states before transferring the entangled state from the first spin and the second spin to the first qubit and the second qubit.

3. The method of claim 2, wherein transferring the entangled state from the first spin and the second spin to the first qubit and the second qubit comprises:
   applying a first swap gate to the first spin and the first qubit; and
   applying a second swap gate to the second spin and the second qubit.

4. The method of claim 1, wherein applying the projective measurements comprises:
   applying a first projective measurement to the first spin, the second spin and the other spins in the mesoscopic system; and
   applying a second projective measurement to only the other spins in the mesoscopic system, wherein the first and second projective measurements cause the first and second spins to transition from the separable states to the entangled state.

5. The method of claim 4, wherein detecting that the first spin and the second spin are in the entangled state comprises detecting equal measurement outcomes from the first projective measurement and the second projective measurement.

6. The method of claim 1, wherein the mesoscopic system comprises an electron spin system subject to a polarizing magnetic field, and performing projective measurements comprises measuring magnetization of the electron spin system along an axis of polarization defined by the polarizing magnetic field.

7. The method of claim 6, wherein the first qubit comprises a first NV center in diamond material, and the second qubit comprises a second NV center in diamond material.

8. The method of claim 1, wherein the initial state of the mesoscopic system comprises the first spin in the |+⟩ state, the second spin in the |+⟩ state and the other spins in the mesoscopic system in a mixed state.

9. The method of claim 1, wherein the initial state of the mesoscopic system comprises the first spin in the |+⟩ state, the second spin in the |−⟩ state and the other spins in the mesoscopic system in a mixed state.

10. The method of claim 1, wherein the entangled state comprises the triplet zero state.

11. The method of claim 1, wherein the entangled state comprises the singlet state.

12. The method of claim 1, wherein the entangled state is transferred from the first spin and the second spin to the first qubit and the second qubit independent of direct coupling between the first qubit and the second qubit.

13. The method of claim 1, wherein the entangled state is transferred from the first spin and the second spin to the first qubit and the second qubit through a first coupling between the first spin and the first qubit and a second coupling between the second spin and the second qubit.

14. A system comprising:
a mesoscopic system comprising a first spin, a second spin and other spins;
first and second qubits, the first qubit coupled to the first spin by a first coupling, the second qubit coupled to the second spin by a second coupling;
a measurement apparatus configured to entangle the first and second spins by performing projective measurements on the mesoscopic system;
a control system configured to:
prepare the mesoscopic system in an initial state that comprises separable states of the first and second spins;
detect an entangled state of the first and second spins based on a series of measurement outcomes obtained by the measurement apparatus after the mesoscopic system has been prepared in the initial state; and
transfer the entangled state from the first and second spins to the first and second qubits through the first and second couplings.

15. The system of claim 14, wherein the first qubit is configured to interact with the first spin through a first dipolar coupling between first qubit and the first spin, and the second qubit is configured to interact with the second spin through a second dipolar coupling between second qubit and the second spin.

16. The system of claim 14, wherein the mesoscopic system comprises an electron spin system in a diamond material.

17. The system of claim 16, wherein the first qubit comprises a first NV center in the diamond material, and the second qubit comprises a second NV center in the diamond material.

18. The system of claim 14, wherein the mesoscopic system is configured to detect a single spin flip in the mesoscopic system.

19. The system of claim 14, wherein the measurement apparatus is configured to entangle the first and second spins by:
applying a first projective measurement to the first spin, the second spin and the other spins in the mesoscopic system; and
applying a second projective measurement to only the other spins in the mesoscopic system, wherein the series of measurement outcomes comprises a first measurement outcome from the first projective measurement and a second measurement outcome from the second projective measurement.

* * * * *